Sept. 15, 1959 J. F. ELLIOTT ET AL 2,904,696

ELECTROLUMINESCENT DEVICE AND NETWORKS

Filed May 15, 1956 3 Sheets-Sheet 1

INVENTORS:
RICHARD E. HALSTED,
JAMES F. ELLIOTT,
BY Charles M. Hutchins
THEIR ATTORNEY.

INVENTORS:
RICHARD E. HALSTED,
JAMES F. ELLIOTT,
BY Charles M. Hutchins
THEIR ATTORNEY.

ELECTROLUMINESCENT DEVICE AND NETWORKS

Filed May 15, 1956 3 Sheets-Sheet 3

INVENTORS:
RICHARD E. HALSTED,
JAMES F. ELLIOTT,
BY Charles M. Hutchins
THEIR ATTORNEY.

United States Patent Office 2,904,696
Patented Sept. 15, 1959

2,904,696

ELECTROLUMINESCENT DEVICE AND NETWORKS

James F. Elliott, Syracuse, and Richard E. Halsted, Ballston Lake, N.Y., assignors to General Electric Company, a corporation of New York Application May 15, 1956, Serial No. 585,027

17 Claims. (Cl. 250—213)

This invention relates to a composite electric circuit element comprising an electroluminescent phosphor and a photoconductor which is adapted for use as an electrical amplifier or signal translating device and to appropriate circuitry therefor.

Active devices such as the vacuum tube, the transistor, and the magnetic amplifier are commonly used as circuit elements for the amplification of electrical energy and for related purposes. Each of such devices has individual characteristics which may be advantageously used in particular applications. Thus the power consumption, size, weight, cost, and operating characteristics such as linearity and frequency response are different for each of these devices and may render one more suitable than another for particular applications.

There are many applications requiring an amplifying device which, when coupled to a resonant circuit or other filter, will not appreciably load the basic filter circuit but will provide a sharply tuned or high Q filter by increasing the effective or overall Q of the system. Here the term "effective Q" is used to mean a measure of the sharpness of peaking of the resonance curve of the output voltage of the system as a function of the frequency of the input voltage. By "increasing the effective Q" is meant that this resonance curve will be more sharply peaked than will the resonance curve of the output voltage across the filter alone. With previously known circuits and devices, it has proven difficult and expensive to obtain such high Q filtering particularly at low audio frequencies.

These difficulties generally result from electrical interaction between the input and output circuit elements included in the structure of the device used, the degree of linearity in its electrical operating characteristics, and from the particular nature of the physical means used to control the flow of power in the output circuit of the device in response to a signal applied to the input circuit. The vacuum tube, for example, utilizes the electric field resulting from a signal applied to the grid to effectively vary the plate resistance of the tube and hence vary the flow of power in the plate or output circuit. Devices such as the transistor in which the current flow occurs solely within solid substances rather than in a vacuum or in a gaseous medium are commonly called solid state devices. The transistor, for example, utilizes the direct injection of current carriers, such as electrons or "holes," from an input terminal to vary the conductivity and hence the flow of power in its output circuit. In both the vacuum tube and in known solid state devices there is usually substantial electrical interaction between the output and the input circuit of the device which frequently results in the above-noted loading of the input circuit.

The device of the present invention minimizes this electrical interaction and consequent loading by utilizing the radiant emission of an electroluminescent phosphor in an input circuit to vary the impedance of an output circuit photoconductor which is electrically insulated from the electroluminescent phosphor and is positioned in radiation-coupled relationship therewith. By an "electroluminescent phosphor" is meant a phosphor which can be made to luminesce or emit radiation under the primary stimulus of an applied electric field or potential. For a further survey and bibliography of the phenomenon of electroluminescence, reference is hereby made to an article entitled "Electroluminescence and Related Topics," by Destriau and Ivey in volume 43, No. 12, December 1955, "Proceedings of the Institute of Radio Engineers," page 1911.

By a "photoconductor" is here meant any material the impedance or conductivity of which varies as a function of the radiation emitted by the particular associated electroluminescent phosphor. The particular nature and properties of both types of materials selected determine the electrical characteristics of the device in a manner to be explained below. By stating that the electroluminescent phosphor and the photoconductor are positioned in "radiation-coupled relationship" it is here meant that they have any physical juxtaposition and geometry which regularly and reproducibly causes the impedance of the photoconductor to vary as a function of the emission from the electroluminescent phosphor.

While this signal translating device of the present invention is particularly well adapted to a high Q filter or other application where isolation of its input and output circuit are utilized, it will of course be understood that it is an amplifying or signal translating device of general utility which can be economically mass produced from sturdy solid state materials, the electrical characteristics of which can be readily controlled through choice of such materials, and which can, if desired, be operated in a highly nonlinear fashion.

It is therefore an object of this invention to provide a novel solid state device comprising an electroluminescent phosphor and photoconductor arranged in electrically-insulated and in light-transmitting relationship.

It is a further object of this invention to provide such a device and circuitry therefor which is adapted for use as an amplifier of electrical signal energy.

It is a further object of this invention to provide active, frequency-sensitive electrical circuits including such a device.

It is a further object of this invention to provide in such a circuit an amplifier which, by proper choice of the materials used in its construction, can be made highly nonlinear in order to enhance the Q of the circuit.

It is a still further object of this invention to provide such a device and associated circuitry which can be economically mass produced and compactly packaged.

Briefly stated, in accordance with one aspect of the invention, an electroluminescent phosphor provided with a pair of input terminals is placed in radiation-coupled relationship with a photoconductor having a pair of output terminals and is separated therefrom by a radiation-transmitting insulator so as to form a four-terminal solid state device with isolated electrical input and electrical output circuits. When used as an amplifier, an electrical signal is applied to the input terminals of the electroluminescent phosphor, and a load impedance and source of power are connected to the output terminals of the photoconductor. The variation in radiation or light output of the electro-luminescent phosphor in response to the variation of the electrical signal varies the impedance of the photo-conductor and thus gates or controls the flow of power in the output circuit. If the input circuit is tuned, as by an inductor, the highly nonlinear voltage-versus-brightness characteristic of the electroluminescent phosphor and the electrical isolation of input and output circuits cause the device to function as a high Q filter or band pass amplifier.

While the novel and distinctive features of the invention are particularly pointed out in the appended claims, a more expository treatment of the invention, in principle and detail, together with additional objects and advantages thereof, is afforded by the following description and accompanying drawings of representative embodiments in which:

Figure 1:
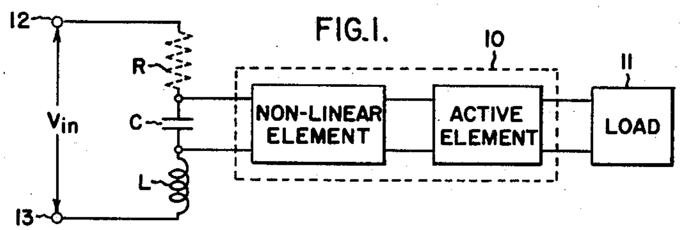
Figure 1 is a block circuit diagram of a network utilizing the principles of the invention.

Turning now to Figure 1 for a diagrammatic illustration of the principles of the invention, a simple series RLC tuned circuit is shown, consisting of an inductor L, a capacitor C, and the inherent resistance R of these elements represented schematically in dashed outline. It is desired that the output of this filter actuate a relay or other similar load device 11 when a signal within a specific narrow frequency band is impressed on the input terminals 12 and 13 of the filter. In order to increase the frequency selectivity or Q of such a filter, a nonlinear element having an output signal the amplitude of which varies as some power of its input signal is interposed between the filter and the load. Further, in order to prevent the nonlinear element from loading the basic RLC circuit, it should be part of a system including an active element so that the input signal need not supply the power to actuate the relay or load device 11. Also, as will be apparent to those skilled in the art, the active portion of the system should be isolated from the nonlinear portion if such loading and consequent degradation of the Q of the filter is to be avoided. Such an active-nonlinear system is shown diagrammatically in the dashed block 10. Input to the system 10 is taken from across the capacitor C of the resonant circuit, and the output of system 10 is applied to the relay or load device 11.

Figure 2:
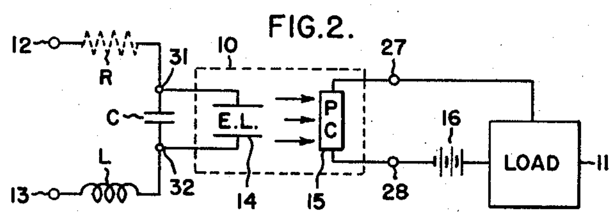
Figure 2 is a schematic circuit diagram of one embodiment of the invention.

A schematic circuit diagram of a specific embodiment of such an ideal circuit is shown in Figure 2. The LC circuit, having inherent resistance R, is provided with terminals 12 and 13 to which an input signal is applied. The capacitor C is provided with terminals 31 and 32 across which is connected the nonlinear element, consisting of a capacitor 14 having an electroluminescent dielectric and designated E. L. in Figure 2. Photoconductor 15, designated PC in Figure 2, is positioned to receive radiation from capacitor 14 and is connected via terminals 27 and 28 in electrical series relation with a battery or other suitable power source 16, and the relay or load device 11. The device 10 of Figure 2 constitutes the active-nonlinear system shown as block 10 in Figure 1. Although a series LC tuned input circuit is shown for purposes of illustration, it will of course be understood that any suitable filter network could be used.

A detailed construction of one embodiment of the device indicated by block 10 of Figure 2 is shown in Figures 3, 4, 5 and 6. A light-transmitting and electrically-insulating slab or member 20, which may consist for example of glass or mica is provided. It will here be understood that the word "light" as used in this application means any radiation emitted by the electroluminescent phosphor to which the photoconductor is responsive and may, for example, include ultra-violet or infra-red radiation. Member 20 has a layer 24 of photoconducting material deposited on one side thereof. This layer may consist for example of the sulfides, selenides or tellurides of cadmium, zinc, or lead, or of any suitable photoconductor which may be deposited by conventional spraying, evaporating or sputtering techniques. A pair of interdigital electrodes 25 and 26 having interleaved fingers are also provided with terminals 27 and 28 respectively to which output circuit leads 29 and 30 are connected. Electrodes 25 and 26 may consist, for example, of silver paste or paint or any suitable conductor extruded, painted, or sprayed on the photoconducting layer 24. It will of course be understood that leads 29 and 30 are merely electrical continuations of these terminals and that any convenient connecting means could be used. Photoconductive layer 24 and its associated electrodes 25, 26 form the photoconducting device indicated by the block 15 of Figure 2.

Figure 4:
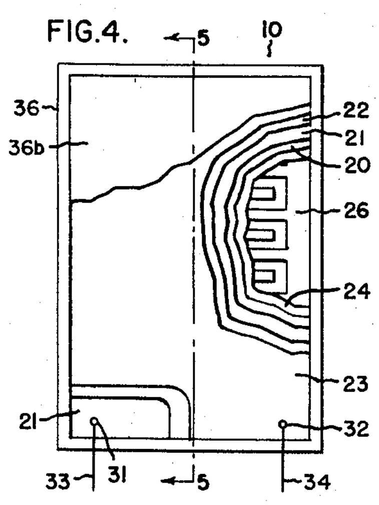
Figure 4 is a partly broken away elevational view of the device of Figure 3.
Figure 5:
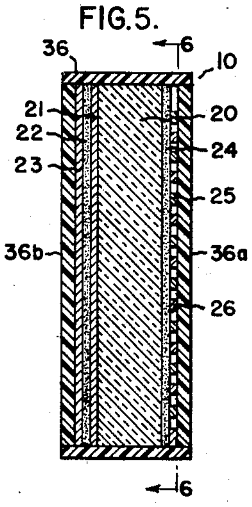
Figure 5 is a section taken on the line 5—5 of Figure 4.
Figure 6:
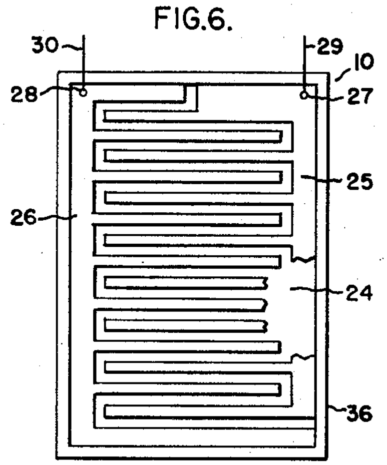
Figure 6 is a section, partly broken away, taken on the line 6—6 of Figure 5.

As best seen in Figure 4, slab 20 further has a transparent conducting coating 21 applied to its other surface. This coating may be a thin transparent layer of tin oxide or a thin metallic layer, either of which may be deposited on slab 20 by conventional techniques. Alternatively, coating 21 may be a transparent conducting layer of titanium dioxide (hereinafter written $TiO_2$) deposited and rendered conducting by the method disclosed in Patent 2,717,844 to L. R. Koller.

Conducting layer 21 has deposited on it a layer 22 of electroluminescent material on which in turn is deposited another conducting layer 23, which may consist of the same transparent conducting material as layer 21 or which may consist of any electrically-conducting and light-reflecting material. The use of a light-reflecting material increases the sensitivity of the device by causing more of the light output of the electroluminescent cell to reach the photoconductor. Conducting layers 21 and 23 are provided with terminals 31 and 32, respectively, to which the input circuit leads or connections 33 and 34 are attached. Thus, conducting layers 21 and 23 constitute the electrodes and electroluminescent layer 22 constitutes the dielectric of capacitor 14.

Electroluminescent layer 22 may be applied by spraying a nitrocellulose or any other well known transparent dielectric binder in which an electroluminescent phosphor is dispersed. The electroluminescent phosphor may be any of the well-known electroluminescent phosphors, as for example zinc sulfide activated by three-tenths percent by weight of copper (hereinafter written ZnS:Cu) or zinc sulfoselenide similarly activated (and hereinafter written ZnSSe:Cu). In this case, electrodes 21 and 23 may be a tin oxide layer or evaporated metallic film, which will be transparent if thin, and reflecting if thicker. The electroluminescent phosphor layer 22 may, however, also be formed either as one or more properly oriented single crystals as disclosed and claimed in U.S. Patent No. 2,271,950 to W. W. Piper et al. or as a film by the vapor reaction technique described and claimed in Patent 2,675,331 to Cusano and Studer. If this latter technique is used however, conducting layers 21 and 23 should be $TiO_2$ which may be deposited by the technique described in U.S. Patent 2,732,313 to Cusano and Studer.

If the electroluminescent phosphor is incorporated in a transparent dielectric binder, it may be excited by an applied A.-C. field. Phosphors such as gallium phosphide (GaP) and silicon carbide (SiC) or copper activated zinc sulfide (ZnS:Cu), when prepared as a continuous crystalline layer in direct contact with point, line or extended area electrodes, may, however, also be excited by D.-C. as well as A.-C. potentials. It will be appreciated that if a dielectric binder is not used the crystalline phosphor will have more nearly the properties of a pure resistance than those of a dielectric. For a more complete discussion of the properties of SiC, reference is hereby made to U.S. Patent No. 2,254,957 to Bay et al.

The entire assembly on member 20 is encased by a sheath or layer 36 of electrically-insulating material. This may be accomplished by various means. The portion **36*a* of casing 36 which is adjacent the electrodes 25 and 26 may consist of any commercially available light-opaque electrically-insulating potting resin, or it may consist of a transparent insulator such as a suitable plastic, glass or mica. Similarly, the portion 36*b* of casing 36 adjacent electrode 23 may also be light-opaque or light-transparent. The rest of the device is enclosed by a layer 36 which consists of the aforesaid light-opaque electrically-insulating potting resin or of any other suitable light-opaque and electrically-insulating material. If either or both of portions 36*a* and 36*b* of the casing are of glass or mica, they may be sealed in place by the layer 36 which may be applied by conventional techniques. If layer 36*b* consists of transparent material, it is desirable that conductor 23** also be of transparent material rather than reflecting material.

When layer **36*a* is transparent, the electrical operation of the device may be biased or modulated by an external light source. When layer 36*b* and conductor 23** are transparent, the device will produce a light output signal as well as an electrical output signal in response to an electrical input signal. Such a light signal output is useful in electro-optical networks, that is, in networks where there is an interaction between signals in the form of electrical energy and signals in the form of radiant light energy. It has, however, been demonstrated that maximum electrical power gain is achieved if all ambient light is excluded and all of the light output of the phosphor reaches the photoconductor.

Figure 7:
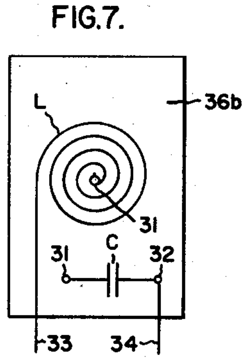
Figure 7 is a plan view of the input circuit side of another embodiment of the device of the present invention.

Furthermore, although input leads 33 and 34 are shown in Figure 4 as adapted to be connected to any external electrical circuit elements, it will of course be understood that as shown in Figure 7 an inductor L and capacitor C, for example may be applied by well known printed circuit techniques to the outer surface of layer **36*b* or other portions of casing material 36. These elements may then be connected as shown in Figure 7 to form, with the electroluminescent cell 14 defined by layers 21, 22, and 23, the complete input side of the circuit of Figure 2. Terminal 31 is internally extended to form the center terminal of the spiral inductor L as shown in Figure 7 and lead 33 is brought out at the other end of inductor L. Capacitor C is connected between terminals 31 and 32. Otherwise, the device of Figure 7 is the same as shown in Figures 3, 4, 5, and 6. Other electrical impedances can of course be similarly printed on any available surface of the device. In some applications it may be desirable to use filters other than a simple resonant circuit. Furthermore, if, in addition to the filter elements, a load resistance with suitable available terminals and terminal connections is printed, all of the necessary passive elements for a complete tuned amplifier stage may be incorporated in one sturdy, compact device. It will of course be understood that the specific materials mentioned above are illustrative only. In particular, layer 22 may consist of any electroluminescent phosphor and, as noted above, may be either of the A.-C. or D.-C. excited type. The circuit of Figure 2 in which the above described device 10** is incorporated may, for example, be used as a nonlinear filter for on-off operations. In such applications a signal having a frequency within the pass band is impressed on the input terminals of the filter and the output of the filter actuates a switch, meter, relay or other similar load device. That is, all that is required is that the RMS, average, or peak value of the output signal vary with the frequency of the input signal.

One specific example of such a nonlinear filtering operation occurs in the "selective call" communication system used in taxicabs and other radio controlled vehicles. The function of the output of the filter in such a system is to turn on the audio portion of the receiver when the receiver picks up, demodulates, and applies to the filter a signal of given frequency corresponding to the "call" frequency. In practice it is desirable that such a filter function in the low audio frequency band, and that the filter have a very high Q or narrow pass band so that the low audio band may contain as many separate call channels as possible. Various types of filters have been proposed for this particular application, but because of size, expense, or response characteristics, none have been wholly satisfactory.

Figure 3:
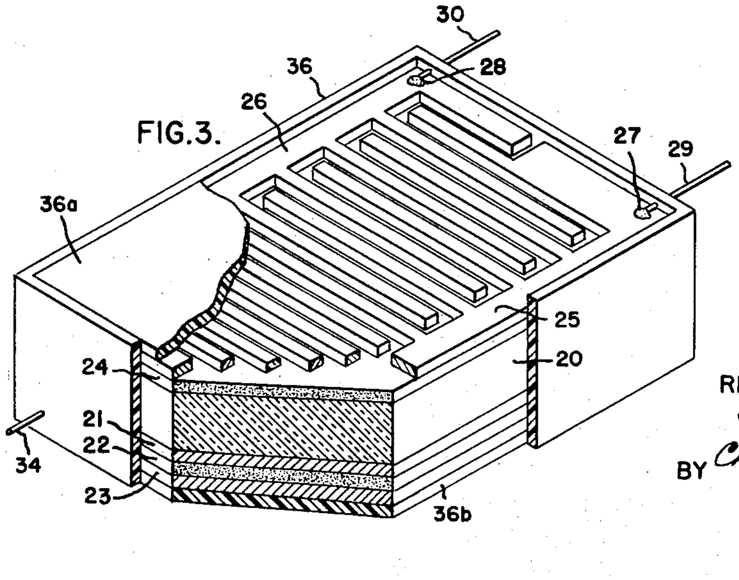
Figure 3 is a partially cut-away perspective view of a solid state device suitable for use in the circuit diagrams of Figures 1 and 2.

The principles on which the present device of Figure 3 in the circuit of Figure 2 is believed to operate may be briefly stated by using the following approximations, which, for the sake of clarity, neglect those factors which are not necessary to the understanding of the electrical operation of the device. The average brightness B of the light output of an electroluminescent phosphor as a function of the voltage $V_c$ applied to it may be closely approximated by the expression, $$(1) \qquad B=kV_c^n$$

when $n$ is a constant characteristic of the particular electroluminescent phosphor used and $k$ is a constant of proportionality. Values of $n$, where $n$ is defined by Equation 1, range approximately from 1 to 7 for known phosphors, and a phosphor such as zinc sulfoselenide activated by copper for which $n$ equals 5 is typical and is readily available.

At resonance, the voltage across any capacitor in a simple series RLC circuit is given by:

$$(2) \qquad V_c=V/Rw_0C=VQ_0$$

where V is the voltage applied to the circuit, $w_0$ is the resonant angular frequency, R and C are the resistance and capacitance of the circuit and $Q_0=1/w_0CR$.

By well known circuit theory applying to single-frequency measured transmission versus frequency characteristics for variable output voltage, $Q_0$ may also be shown to be equal to $$\Delta\frac{w_0}{w}$$

where $\Delta w=w_2-w_1$. Here $w_0=1/\sqrt{LC}$ and $w_2$ and $w_1$ are angular frequencies on opposite sides of $w_0$ and are the limits of an arbitrarily defined pass band within the current I flowing in the circuit is equal to or greater than $V/\sqrt{2(R)}$. That is to say, $w_2$ and $w_1$ are the half power frequencies at which the power $I^2R$ is equal to $V^2/2R$ and at which half of the energy supplied to the circuit is stored and half is dissipated. Thus $Q_0$ may be regarded as a measure of the width of the pass band $\Delta w$ or, as noted above, as a measure of the selectivity of the circuit.

If the electroluminescent capacitor 14 is connected across the capacitor of the resonant circuit, then at resonance its brightness output is, from (1) and (2), $$(3) \qquad B=k(VQ_0)^n$$

where as noted above, a value of $n$ equal to 5 is readily attainable. This implies that the brightness output is far more sharply peaked at resonance than is the voltage across a simple capacitor alone due to the introduction of the exponent $n$. This more sharply varying brightness output is used to control the impedance of a photoconductor.

In the presence of radiation, the impedance, $Z_p$, of many known photoconductors decreases below the dark-impedance value which the photoconductor has in the absence of radiation approximately according to an inverse linear function of the brightness B of the radiation incident thereon. That is, $$cB=1/Z_p=I_p/V_p$$

or;

$$I_p=cBV_p \quad (4)$$

where $I_p$ is the photoconductor current, $c$ is a constant of proportionality and $V_p$ is the no load voltage applied to the photoconductor from a power source such as battery 16. When one reconverts the sharply varying light signal output of the electroluminescent cell back to an electrical output signal by letting it impinge on such a photoconductor in series with a suitable power source and a load impedance, a high Q filter and tuned band pass amplifier is obtained.

The basic principle on which the amplifying action of the device depends is that applicable to any amplifying device. That is, a low power level signal applied to an input circuit gates or controls the flow of power at a higher level in an output circuit by varying the total impedance of the output circuit. The degree of nonlinearity which can be achieved in the electrical transfer characteristic of an amplifying device however, is a characteristic of the particular device. By "electrical transfer characteristic" is here meant the relationship which exists between the output signal (expressed as output circuit current) and the input signal (expressed as input signal voltage) for various values of output circuit supply voltage.

Thus, for the triode vacuum tube, the familiar Child-Langmuir three-halves power law (when applied to the equivalent diode in a manner well-known in the literature of the art) relates the electron current $I_k$ to plate and grid voltages $V_p$ and $V_g$ by the expression $$I_k=G/\mu_0^{3/2}(V_p+\mu_0 V_g)^{3/2} \quad (5)$$

where G is the perveance of the equivalent diode and $\mu_0$ is the geometrical amplification factor of the tube.

For the device of the present invention it follows from Equations 4 and 3 that, at resonance $$I_p=ckV_p(VQ_0)^n \quad (6a)$$

or:

$$I_p=A_1V^n \quad (6b)$$

where $A_1$ equals $ckQ_0^nV_p$, as noted above, $n$ may be determined by the choice of phosphor used but has a typical value of 5. V, of course, is the signal voltage applied to the terminals of the resonant circuit just as $V_g$ is the signal voltage applied to the grid of the vacuum tube.

Thus for the device of the present invention the output current varies as the $n$th power of input signal rather than as a function involving a three-halves power. Furthermore, as noted above, $n$, and hence the degree of nonlinearity, can be readily varied from the illustrative typical value of 5 by choice of an appropriate phosphor.

The other factor determining effective Q for the tuned input device is the degree of loading of the input filter by the amplifier. Due to the four-terminal properties of the device of the present invention, the input and output circuits may be electrically isolated except for capacitive coupling which can be reduced to negligible values by proper choice of the geometry and the dielectric constant of the transparent insulator positioned between the electroluminescent capacitor and the photoconductor.

If the input circuit is not tuned, it may be easily shown from Equations 1 and 4 that $$I_p=ckV_pV_c^n \quad (7a)$$

or;

$$I_p=A_2V_c^n \quad (7b)$$

where $A_2=ckV_p$ is now a constant at any frequency if only $V_p$ is constant and if one neglects the slight inherent variation of the brightness of an untuned electroluminescent capacitor with the frequency of the exciting voltage. This inherent variation of brightness with frequency is in fact negligible by comparison with the variation with the amplitude of the exciting voltage $V_c$. Thus even in the untuned case comparison of Equations 7a and 5 reveals a sharp difference in the linearity of the transfer characteristic of the vacuum tube and the present radiation-coupled amplifier.

It is therefore apparent that the differences between various amplifying devices include the nature and characteristic of the physical mechanism used to control the flow of power in the output circuit, the resulting degree of nonlinearity of the transfer characteristic, the resulting coupling between the input and the output circuit, and the ease with which these characteristics of the device may be controlled in manufacture.

As in vacuum tube circuits, a radiation-coupled amplifier circuit will afford linear amplification only when operated over an effectively linear region of its transfer characteristic curve. One distinct advantage of the radiation-coupled amplifier however, lies precisely in the large degree of non-linearity which can be readily obtained for high Q applications and in the steepness of the slope of the effectively linear portion of the transfer characteristic. Another advantage is the large degree of electrical isolation between the input and output circuits which results from using light as the impedance controlling medium, and from the irreversible nature of this transfer phenomenon. From this advantage, it follows that several such devices may be cascaded without loading the previous stages. Here, by a stage is meant the device and its associated elements. The cascaded arrangement further improves the effective Q of the overall circuit.

It should also be noted that presently known A.-C. excited electroluminescent phosphors such as Zns:Cu or ZnSSe:Cu have a characteristic frequency response limit beyond which their instantaneous light output will not follow the variations of electrical input signal. Also, below this frequency response limit the light output waveform has a frequency twice that of the exciting voltage since the brightness increases from zero during both halves of each electrical cycle. Within the frequency response limits characteristic of its phosphor, the device may therefore be used as a full wave rectifier or as a frequency doubler. Of course, in a cascaded arrangement higher harmonics of the electrical input signal may be obtained. The particularly simple manner in which this is achieved is a further advantage of the device of the present invention.

Furthermore, many of the known photoconductors have a distinct limit to their frequency response. Cadmium sulfide, for example, will not follow light signal variations above the low audio range. Therefore if either the electroluminescent phosphor or the photoconductor response is such that it will follow only the envelope of a modulated carrier input signal, the tuned input device acts as a detector of low frequency amplitude modulation on any higher frequency carrier to which it is tuned. Frequency modulation may also be detected as a decrease in voltage across the load impedance due to variation in voltage across the resonant circuit with variations away from resonant frequency.

Even with presently known materials, a wide variety of operating characteristics may be obtained. Thus the electroluminescent phosphor, as noted above, may be prepared to be either A.-C. excited or D.-C. excited. If A.-C. excited, the capacitance of the cell is readily varied by choice of its geometry and dielectric. Also, the photoconductor may be one chosen for a particular desired frequency response, and the output power supply may be D.-C. of either polarity or it may be A.-C. This is due to the fact that, unlike a vacuum tube circuit, there is no rectifying action in the output circuit of the radiation-coupled amplifier due to the extended contact, rather than point contact, of electrodes 25 and 26 with photoconductor 24.

Of course, for such nonlinear or on-off functions as actuating a relay, neither the frequency response nor the instantaneous waveform of the light output of the electroluminescent phosphor nor the frequency response of the photoconductor is important. Regardless of the frequency of the applied voltage the average brightness B of the cell will vary according to Equation 1, that is $B=kV_c^n$. Since $V_c$ will vary according to the frequency of the voltage V applied to the resonant circuit, the tuned input device will function as a nonlinear high Q filter over a wide frequency range. It is only the degree of linearity in reproduction of the instantaneous waveform of signals of various frequencies which is affected by the frequency response of the materials used. The nonlinear Q enhancing function depends entirely on average brightness, not on instantaneous brightness.

While the priciples on which the operation of the device is believed to depend have been set forth above, it should be emphasized that the correctness or incorrectness of the theoretical explanation of the operation of the circuit of Figure 2 attempted above does not affect the substance of our invention since it is a fact of experience that a device constructed in accordance with the present specification will operate in a manner to be illustrated by the typical observed data set forth below.

Figure 8:
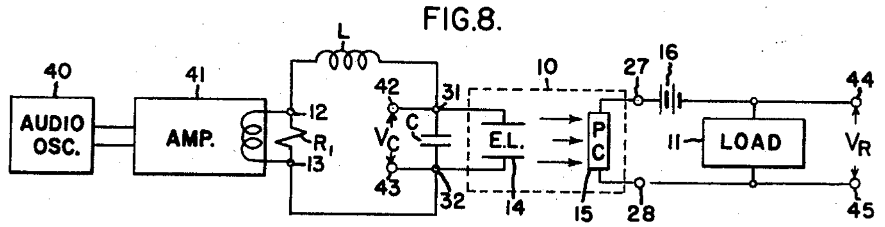
Figure 8 is a schematic diagram of a circuit used to measure the Q enhancing properties of the device of Figures 3, 4, 5, and 6.
Figure 9:
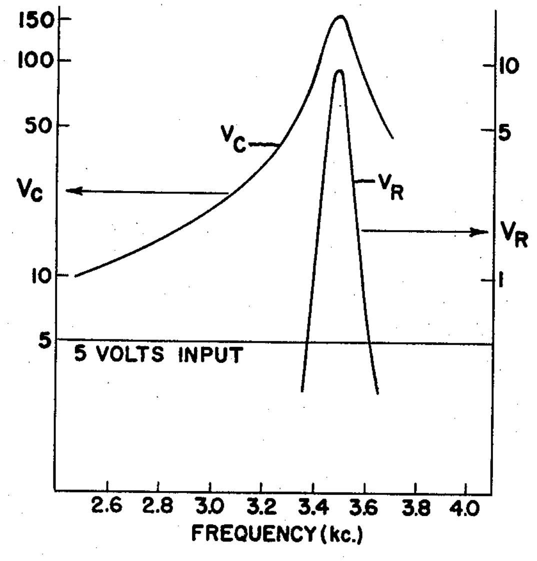
Figure 9 is a graph of data obtained with the circuit of Figure 8.

The observed data shown in Figure 9, demonstrating Q enhancement by one particular radiation-coupled amplifier, were obtained with the circuit shown in Figure 8. Electroluminescent cell 14 of this illustrative device consisted of a zinc sulfoselenide phosphor having 80 parts by weight sulfur to 20 parts selenium, activated with 0.3 wt. percent copper and dispersed in a transparent dielectric comprising 70 parts by weight nitrocellulose to 30 parts of a castor oil modified glyceryl-phthalate alkyd resin to which transparent electrodes were applied to form a capacitor which was of a size giving a capacitance of .001 microfarad. The value of *n* for this phosphor is about 5. A cadmium sulfide photoconductor was used with the above phosphor in an assembly from which ambient light was excluded.

A tunable audio oscillator 40 was connected to amplifier 41, the output of which was applied across a 5-ohm resistor $R_1$ to feed the resonant circuit. The resonant circuit in this particular case consisted of an inductor L of 200 millihenries and a capacitor C of .01 microfarad across which the electroluminescent capacitor 14 was connected. A 180-volt battery, 16, was connected in series with the cadmium sulfide photoconductor and with a load 11 consisting of a 5000-ohm relay. A constant-voltage-variable frequency input signal of 5 volts was applied to the terminals 12 and 13 of the resonant circuit and measurements were made of the voltage $V_c$ appearing across terminals 42 and 43 of capacitor C, and of the voltage $V_r$ appearing across terminals 44 and 45 of load relay 11.

Figure 10:
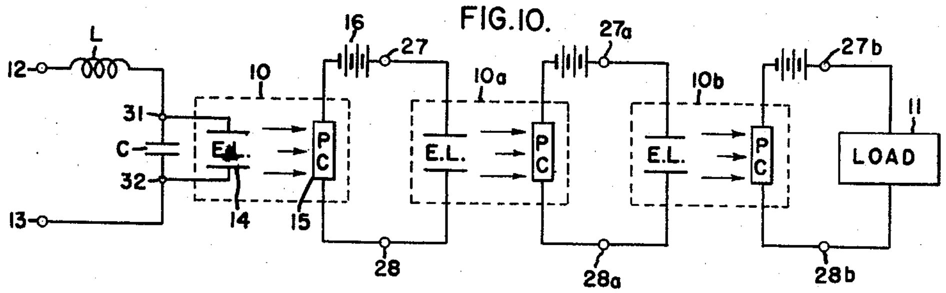
Figure 10 is a schematic diagram of a plural stage circuit embodiment of the present invention.

The voltage $V_c$ is compared to the voltage $V_r$ in Figure 9, which shows both of these voltages as a function of the frequency of the applied voltage. Calculations from the plotted data indicate that this single stage device decreases the bandwidth of the resonance curve of $V_r$ by a factor of 2.5 at the 3 db point and by a factor of 5 at the 20 db point as compared to the resonance curve of $V_c$, thus giving substantial Q enhancement in a filter of the type which could be used in such applications as a selective call communication system. If the improvement in selectivity obtained with a single device, which with its associated elements may be said to form a single stage, is not sufficient, a plurality of stages may be cascaded as illustrated in Figure 10 until the desired selectivity is obtained or until noise becomes a limiting factor. This latter limitation is of course determined by the nature of the materials used. Figure 10 shows a circuit similar to that of Figure 2, but having untuned stages 10*a* and 10*b* interposed between input stages 10 and relay 11. As noted above, a stage is considered to be the device and its associated elements. It is here said to be a "tuned stage" if input is taken from a frequency selective network and an "untuned stage" if input is taken from any other source.

It should be noted that the tuned stage will function in accordance with Equations 6 above whereas the untuned stages will function in accordance with Equations 7 above. That is to say, once the tuned input stage produces a voltage which is peaked as a function of frequency, the sharpness of this peaking may be increased by an untuned stage due to the effect of the exponent *n* in Equation 7*b*, $I_p=A_2V_c^n$, since the load impedance of each stage is the impedance of the electroluminescent input capacitor in the following stage. If desired, this load impedance may be adjusted through the use of associated impedances in a conventional manner.

Figure 11:
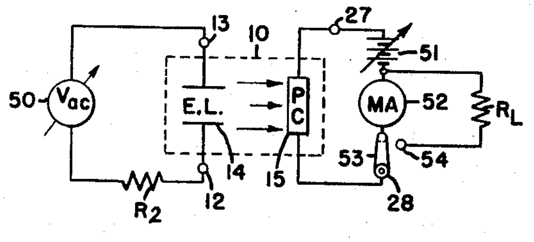
Figure 11 is a schematic diagram of a circuit used to measure the amplifying properties of the device of Figures 3, 4, 5, and 6 when operated as an untuned amplifier.
Figure 12:
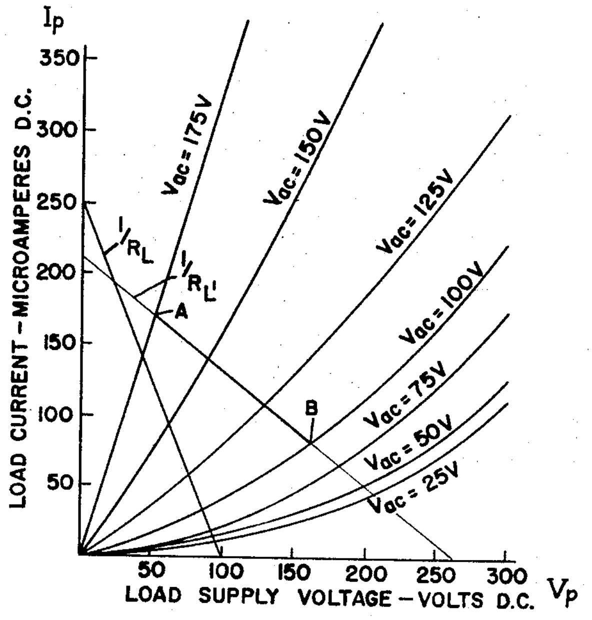
Figure 12 is a graph of the data obtained with the circuit of Figure 11 showing curves of output current vs. output supply voltage for various values of input signal, and also including load lines for the amplifier circuit.

The power amplifying properties of such a simple untuned radiation-coupled amplifier stage were measured by the illustrative circuit of Figure 11 and the resulting data plotted in Figure 12. The particular device tested consisted of a glass slab 20 which measured about 2 by 2¼ inches and was about 1/32 of an inch thick. The electroluminescent phosphor used was zinc sulfide activated by 0.3 percent by weight copper (for which *n* had a value of about 5) dispersed in a transparent dielectric comprising 70 parts nitrocellulose by weight to 30 parts of a castor oil modified glyceryl-phthalate alkyd resin. The transparent electrodes, the phosphor, and the cadmium sulfide photoconductor were deposited as thin films on slab 20. The interdigital output electrodes consisted of silver paste. The equivalent series resistance and capacitance of the electroluminescent capacitor were measured by standard techniques as R cell=127 ohms and C cell=.004 microfarad.

As shown in Figure 11, a variable A.-C. source 50 having an output voltage $V_{ac}$ was applied to terminals 12 and 13 of device 10 through a resistor $R_2$ of 100 ohms. By measuring the voltage across this resistor, the input current was measured. A variable D.-C. power source 51 having a voltage $V_p$ was connected to terminal 27 and in series with a microammeter 52 which was connected through switch 53 to the other output terminal 28 of device 10. Switch 53 was a single-pole double-throw switch which in its other position connected a load resistor $R_L$ into the output circuit to form an untuned radiation-coupled amplifier circuit.

Data to show curves of load current $I_p$ in D.-C. microamperes as read by microammeter 52 for various values of the load supply voltage $V_p$ of source 51 as a function of different values of A.-C. input voltage $V_{ac}$ were taken and are plotted in Figure 12. A load line $1/R_L$ for a load resistance of 0.4 megohm is also plotted.

If the plotted curves of Figure 12 are compared with Equation 7*a* above, the degree of approximation in the assumptions used to derive this equation may be observed. Thus, Equation 7*a* relates the load current $I_p$ to the load supply voltage $V_p$ and the input signal voltage $V_c$, or here $V_{ac}$ (neglecting the potential drop across $R_2$) by the expression, $$(7a) \qquad I_p=ckV_pV_c^n$$

which here may be written, $$(8) \qquad I_p=ckV_p(V_{ac})^n$$

In Figure 12, each plotted line represents observed values of $I_p$ as a function of $V_p$ for constant values of $V_{ac}$. Where $V_{ac}$ is constant, $I_p$ is predicted by Equation 8 to be a linear function of $V_p$ as it very nearly is for $V_{ac}$ equal to 175 or 150 volts. At lower values of $V_{ac}$, curvature is introduced. This would appear to result from the fact that, in the presence of slow changes in applied voltage and current, the photoconductor is inherently a nonlinear impedance at zero or low levels of illumination (which is here equivalent to low values of $V_{ac}$) and approaches linearity at higher levels of illumination. This was not taken into account in deriving Equation 7*a*.

Furthermore, both Equations 1 and 4 are only approximations to the characteristics of the electroluminescent phosphor and the photoconductor respectively and to the coupling between them. These simplified approximations are used merely to more clearly illustrate the basic principle involved in the operation of the device.

For any particular device, Equation 1 should be empirically derived from plotted data of the brightness characteristic of the phosphor used, Equation 4 should similarly be derived the empirical characteristics of the photoconductor, and Equation 7*a* should be empirically derived from the plotted electrical characteristics of the device. For any photoconductor, Equation 4, $I_p=cBV_p$, should of course also include a term to represent the above-noted dark impedance of the photoconductor when the brightness B of radiation incident thereon is zero.

That these correction factors are, however, mere refinements which do not appear to affect the validity of the basic principles stated above, may be seen by comparing Equation 7*a* with the line $V_{ac}$=175 v. in the plotted observed data shown in Figure 6*b*. A more refined or complete mathematical expression would clearly reduce to Equation 7*a* as the photoconductor impedance changes from its nonlinear dark value to its linear high brightness value.

The following pertinent data for specific points were taken at a frequency of 60 cycles per second with the above described particular untuned device.

*Table 1*

| $V_{ac}$ | $I_{ac}$ |
|---|---|
| 175 v. | $\frac{.045 \text{ v. peak to peak}}{100 \text{ ohms}}$=0.16 ma. R.M.S. |
| 150 v. | $\frac{.035 \text{ v. peak to peak}}{100 \text{ ohms}}$=0.124 ma. R.M.S. |

Input Power: $P=I_{ac}^2$ R cell; R cell=127 ohms $P_1=(0.16\times10^{-3})^2\times127=3.25$ microwatts
$P_2=(0.124\times10^{-3})^2\times127=1.96$ microwatts
$\Delta P_{in}=1.29$ microwatts Output Power$=(\Delta I_p)^2R_L$
$=[(125-85)\times10^{-6}]^2\times0.4\times10^6$
$=1600\times10^{-12}\times0.4\times10^6=640$ microwatts The power gain of the A.-C. to D.-C. amplifier in this case is $$G_p=\frac{640 \text{ microwatts}}{1.29 \text{ microwatts}}$$

which is approximately a factor of 500 or 27 db power gain. Similar results could also be achieved for A.-C. to A.-C., D.-C. to D.-C., or D.-C. to A.-C. amplifiers.

The above figures are typical or nonlinear operation of the device described in detail above. This type of operation would be used for Q enhancement in relay or on-off circuits in the manner described in connection with Figures 8 and 9. Also shown on Figure 12, however, is a load line $1/R_L'$ for $R_L'$=1.25 megohms. From the nearly equal spacing along the load line between lines $V_{ac}$=175, 150, 125, and 100, it is obvious that operation along this load line between the points A and B would be substantially linear.

It is thus apparent that the device 10 is an amplifier of general utility within the limitations imposed by the electroluminescent light output waveform and frequency response and by the photoconductor response time. Important characteristics which distinguish it from other amplifying devices are: (1) the electrical isolation between the light-coupled input and output circuits of the four-terminal device, (2) the possibility of connecting either an A.-C. supply or a D.-C. supply of either polarity to both the input and output circuits, (3) the high degree of nonlinearity easily obtained, (4) its frequency-doubling properties when A.-C. excited, (5) the ease with which its electrical characteristics can be controlled by geometrical design and choice of materials, and (6) the simplicity and economy of the method by which it may be manufactured in the form of a sturdy, compact, solid state device.

While the device 10 has particular utility as a means for improving the Q or selectivity of a filter for controlling such nonlinear devices as the relay in a selective call communication system, it is apparent that it also has many other applications. In such nonlinear applications, the frequency-doubling property and light output waveform of the electroluminescent phosphor are not important. All that is required is that the device have an output signal in response to an input signal within a narrow frequency band. In this application the nonlinearity represented by large values of $n$ in the equations $B=kV_c^n$ and $I_p=A_1V^n$ is highly desirable. On the other hand it should be noted that the range of values of $n$ obtainable by using different phosphors which are well known in the literature of the art permits one to choose a value of $n$ which will determine the electrical transfer characteristic equation in accordance with the needs of any particular application.

Although the frequency-doubling property of the light output waveform may be utilized in tuned or untuned full-wave rectifying or frequency-doubling circuits at frequencies within the limits of frequency response of the electro-luminescent phosphor, this property is not troublesome in applications of the device as an amplifier and detector of modulated higher frequency carrier waves. Once a frequency is reached at which the light output waveform of the phosphor will not follow the instantaneous carrier frequency variations, the average amplitude of the voltage across the capacitor serves to maintain an average level of light output which can be modulated by the lower frequency amplitude modulations of the voltage across the capacitor. Within the limits of its response time, the photoconductor responds to the low frequency variations. These variations may result from either amplitude or frequency modulation of the signal applied to the tuned input circuit. Even under operating conditions which are not perfectly linear, i.e., under conditions giving rise to some distortion, the device will at a minimum act as a detector of digitally pulsed modulations or information since exact reproduction of the rectangular pulse waveform is not important. As in the case of actuating a relay, all that is required to detect such digitally pulsed information is an output signal indicating that a pulse was or was not present. The presence or absence of such a signal may be used to indicate a 1 or a 0 in the binary number system as is well known in the art. If the tuned input device is used, such an indication may be obtained in response to a signal of preselected frequency. It is thus seen that each of the properties peculiar to the radiation coupled amplifier as determined by its design and the material used in its construction may be utilized in the appropriate application.

While the principles of the invention have now been made clear in illustrative embodiments, there will be immediately obvious to those skilled in the art many modifications in structure, arrangement, proportions, the elements, materials, and components, used in the practice of the invention, and otherwise, which are particularly adapted for specific environments and operating requirements, without departing from those principles. The appended claims are therefore intended to cover and embrace any such modifications, within the limits only of the true spirit and scope of the invention.

What we claim as new and desire to secure by Letters Patent of the United States is:

1. An article of manufacture comprising, a first pair of electrodes, electrical input connection means connected to each of said first pair of electrodes, an electroluminescent phosphor positioned between said first pair of electrodes; a second pair of electrodes electrically independent of said first pair, electrical output connection means connected to each of said second pair of electrodes, a photoconductor connected between said second pair of electrodes, said electroluminescent phosphor and said photoconductor being electrically insulated from each other and being positioned in radiation-coupled relationship, said photoconductor having an impedance which varies as a function of the radiation from said electroluminescent phosphor; said first and second pair of electrodes, said electroluminescent phosphor and said photoconductor being encased in an electrically insulating material, an inductive impedance element on said encasing material, said impedance element being connected to said input connection means.

2. An amplifier comprising a capacitor, said capacitor having a dielectric comprising an electroluminescent phosphor, a resonant circuit, means connecting said capacitor across an element of said resonant circuit, means to apply an electrical signal to said resonant circuit, a photoconductor electrically insulated from and positioned in radiation-coupled relationship with said electroluminescent capacitor, said photoconductor having an impedance which varies as a function of the incident radiation emitted from said electroluminescent phosphor; electrical output connections to said photoconductor, and a source of electrical energy and a load impedance connected to said output connections, whereby the variation of the impedance of said photoconductor as a function of the radiation from said electroluminescent phosphor in response to an applied signal causes a variation of the flow of power from said source of electrical energy and results in an amplified signal appearing across said load impedance.

3. An article of manufacture comprising, a light-transmitting electrically insulating member, a first layer comprising a light transmitting electrically conductive material in extended contact with one side of said member, a second layer comprising an electroluminescent phosphor in extended contact with said first conductive layer, a third layer comprising an electrically conductive material in extended contact with said electroluminescent layer, an independent electrical input connection to each of said conductive layers; a fourth layer comprising a photoconductive material in extended contact with another side of said light-transmitting insulating member, said photoconductor having an impedance which varies as a function of the radiation from said electroluminescent phosphor, a plurality of output electrodes contacting said photoconductive layer and being in spaced apart relationship to each other upon one surface of said photoconductive layer, and an independent electrical output connection to each of said output electrodes.

4. An article of manufacture comprising, a light-transmitting electrically insulating member, a first layer comprising a light-transmitting electrically conductive material in extended contact with one side of said member, a second layer comprising an electroluminescent phosphor in extended contact with said first conductive layer, a third layer comprising an electrically conductive-light reflecting material in extended contact with said electroluminescent layer, an independent electrical input connection to each of said conductive layers; a fourth layer comprising a photoconductive material in extended contact with another side of said light-transmitting insulating member, said photoconductor having an impedance which varies as a function of the radiation from said electroluminescent phosphor, a plurality of output electrodes contacting said photoconductive layer and being in spaced apart relationship to each other upon one surface of said photoconductive layer, and an independent electrical output connection to each of said output electrodes, said article being encased in an electrically-insulating light-opaque material.

5. An article of manufacture comprising, a light-transmitting electrically-insulating member, a first layer comprising a light-transmitting electrically-conductive material in extended contact with one side of said member, a second layer comprising an electroluminescent phosphor in extended contact with said first conductive layer, a third layer comprising an electrically-conductive material in extended contact with said electroluminescent layer, an independent electrical input connection to each of said conductive layers; a fourth layer comprising a photoconductive material in extended contact with an opposite side of said light-transmitting insulating member, said photoconductor having an impedance which varies as a function of the radiation from said electroluminescent phosphor, a pair of interdigital electrodes contacting said photoconductive layer and being in spaced apart relationship to each other upon one surface of said photoconductive layer, and an independent electrical output connection to each of said interdigital electrodes.

6. An article of manufacture comprising, a light-transmitting electrically insulating member, a first layer comprising a light-transmitting electrically conductive material in extended contact with one side of said member, a second layer comprising an electroluminescent phosphor in extended contact with said first conductive layer, a third layer comprising an electrically-conductive material in extended contact with said electroluminescent layer, a fourth layer comprising a photoconductive material in extended contact with another side of said light-transmitting insulating member, said photoconductor having an impedance which varies as a function of the radiation from said electroluminescent phosphor, a plurality of output electrodes contacting said photoconductive layer and being in spaced apart relationship to each other upon one surface of said photoconductive layer, said article being encased in an electrically insulating material, electrical input connections to each of said first and said third conductive layers, and electrical output connections to each of said output electrodes, said output connections being independent of said input connections.

7. Apparatus as in claim 6 wherein a conductive impedance element is printed on said encasing material and is connected to at least one of said input connections.

8. Apparatus as in claim 6 wherein the portion of said encasing material adjacent to said third conductive layer is light-opaque, and said third conductive layer is light-reflecting.

9. Apparatus as in claim 6 wherein said third conductive layer and the portion of said encasing material adjacent to said third conductive layer are both light-transmitting and the rest of said encasing material is light-opaque.

10. Apparatus as in claim 6 wherein the portion of said encasing material adjacent to said output electrodes is light-transmitting and the rest of said encasing material is light-opaque.

11. Apparatus as in claim 6 wherein said third conductive layer, the portion of said encasing material adjacent to said third conductive layer, and the portion of said encasing material adjacent to said output electrodes are each light-transmitting and the rest of said encasing material is light-opaque.

12. In an amplifier of electrical energy, an input circuit comprising an electroluminescent phosphor positioned between a first pair of electrodes and forming an electroluminescent capacitor, means to tune said input circuit to resonance at a predetermined frequency; an output circuit comprising a photoconductor positioned between a second pair of electrodes, said electroluminescent phosphor and said photoconductor being electrically insulated from each other and being positioned in radiation-coupled relationship, said photoconductor having an impedance which varies as a function of the radiation from said electroluminescent phosphor; means to apply an electrical signal to said input circuit, and a source of electrical energy and a load impedance in said output circuit, whereby the variation of the impedance of said photoconductor as a function of the radiation from said electroluminescent phosphor in response to an applied signal causes a variation of the flow of power from said source of electrical energy and results in an amplified signal appearing across said load impedance.

13. An article of manufacture comprising, a slab of transparent electrically insulating material, a first layer comprising a light-transparent electrically conductive material in extended contact with one side of said slab, a second layer comprising an electroluminescent phosphor in extended contact with said first conductive layer, a third layer comprising an electrically-conductive and light-reflecting material in extended contact with said second layer; a fourth layer comprising a photoconductor in extended contact with the other side of said slab, said photoconductor having an impedance which varies as a function of the radiation from said electroluminescent phosphor, a pair of interdigital electrodes in extended contact with the side of said photoconductor layer opposite said slab, said article being encased by an electrically-insulating and light-opaque material, electrical input connections to each of said first and third conductive layers, and electrical output connections to each of said interdigital electrodes, said output connections being electrically independent of said input connections.

14. An electrical network comprising, an electrically passive filter network, means to apply an electrical signal to said network, means to apply the output of said network to a capacitor having a dielectric comprising an electroluminescent phosphor, said phosphor having a non-linear voltage versus brightness characteristic; a pair of output electrodes, a photoconductor connected between said pair of electrodes, said photoconductor being electrically insulated from and positioned in radiation-coupled relationship with said electroluminescent phosphor, said photoconductor having an impedance which varies as a function of the radiation from said electroluminescent phosphor; and a source of electrical energy and a load impedance connected to said photoconductor electrodes.

15. An electrical network comprising a resonant circuit, means to apply an electrical signal to said resonant circuit, a capacitor connected across one element of said circuit, said capacitor having a dielectric comprising an electroluminescent phosphor, said phosphor having a non-linear voltage versus brightness characteristic, a pair of output electrodes, a photoconductor connected between said pair of electrodes and being electrically insulated from and positioned in radiation-coupled relationship with said electroluminescent phosphor, said photoconductor having an impedance which varies as a function of the radiation from said electroluminescent phosphor; said photoconductor and said electroluminescent capacitor being encased by an electrically-insulating light-opaque material, and a source of electrical energy and a load impedance connected to said photoconductor electrodes.

16. An amplifier circuit having a plurality of cascaded stages; each of said stages comprising, a capacitor, said capacitor having a dielectric comprising an electroluminescent phosphor, electrical input connections to said capacitor; a photoconductor electrically insulated from and positioned in radiation-coupled relationship with said electroluminescent phosphor, said photoconductor having an impedance which varies as a function of the radiation emitted from said electroluminescent phosphor, and electrical output connections to said photoconductor; a source of electrical energy and the input connections of the next stage being connected to the output connections of each preceding stage respectively, means to apply an electrical signal to the input connections of the first stage, and a source of electrical energy and a load impedance being connected to the output connections of the last stage.

17. An amplifier circuit having a plurality of cascaded stages; each of said stages comprising a capacitor, said capacitor having a dielectric comprising an electroluminescent phosphor, electrical input connections to said capacitor; a photoconductor electrically insulated from and positioned in radiation-coupled relationship with said electroluminescent phosphor, said photoconductor having an impedance which varies as a function of the radiation emitted from said electroluminescent phosphor, and electrical output connections to said photoconductor; means to tune the capacitor of at least one of said stages to resonance at a selected frequency; a source of electrical energy and the input connections of the next stage being connected to the output connections of each preceding stage respectively, means to apply an electrical signal to the input connection of the first stage, and a source of electrical energy and a load impedance being connected to the output connections of the last stage.

References Cited in the file of this patent

UNITED STATES PATENTS

| | | |
|---|---|---|
| 1,855,863 | McCreary | Apr. 26, 1932 |
| 2,605,335 | Greenwood | July 29, 1952 |
| 2,812,446 | Pearson | Nov. 5, 1957 |

OTHER REFERENCES

Loebner: "Opto-Electronic Devices and Networks," pages 1897–1906, Proc. I.R.E., December 1955.

Mellon Inst. of Industrial Res., (A) Quarterly Rev. #3, Fellowship on Computer Components #347, date 1951, pp. V1–90, and Fig. V1–4.

Mellon Inst. of Industrial Res., (B) Quarterly Rev. #3, second series of the Computer Components Fellowship 347, pp. I–22 and I–23 and Figs. 7 and 8.

Marshall: "Optical Elements for Computers," Quarterly Rpt. No. 6, Computer Components Fellowship No. 347, Mellon Institute of Industrial Research, University of Pittsburgh, June 1952, Fig. 6.